(12) United States Patent
Hokazono

(10) Patent No.: US 7,427,796 B2
(45) Date of Patent: Sep. 23, 2008

(54) SEMICONDUCTOR DEVICE AND METHOD OF MANUFACTURING A SEMICONDUCTOR DEVICE

(75) Inventor: Akira Hokazono, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 246 days.

(21) Appl. No.: 11/053,600

(22) Filed: Feb. 9, 2005

(65) Prior Publication Data
US 2006/0063362 A1 Mar. 23, 2006

(30) Foreign Application Priority Data
Sep. 21, 2004 (JP) ............................. 2004-273849

(51) Int. Cl.
H01L 29/76 (2006.01)
H01L 29/94 (2006.01)
H01L 31/062 (2006.01)
H01L 31/113 (2006.01)
H01L 31/119 (2006.01)

(52) U.S. Cl. ..................... 257/412; 257/384; 257/385; 257/377

(58) Field of Classification Search ................ 438/583; 257/388, 377, 364, 382–384, 412
See application file for complete search history.

(56) References Cited

U.S. PATENT DOCUMENTS 7,112,483 B2 * 9/2006 Lin et al. .................... 438/231

OTHER PUBLICATIONS

J. Kedzierski et al., "Issues in NiSi-gated FDSOI Device Integration", IEDM Tech. Digest, 2003, pp. 441-444.

* cited by examiner

Primary Examiner—Chuong Anh Luu
(74) Attorney, Agent, or Firm—Foley & Lardner LLP

(57) ABSTRACT

A semiconductor device according to an embodiment of the present invention comprises a first transistor including: a first source layer and a first drain layer both formed in one surface of a semiconductor substrate; a first silicide layer formed on the first source layer and the first drain layer; a first gate electrode formed on a first gate insulating film formed on the surface of the semiconductor substrate and having a second silicide layer; and a silicon nitride film formed on the sidewall of the first gate electrode; a second transistor including: a second source layer and a second drain layer both formed in the surface of the semiconductor substrate; a third silicide layer formed on the second source layer and the second drain layer and equal in thickness to the first silicide layer; a second gate electrode formed on a second gate insulating film formed on the surface of the semiconductor substrate and having a fourth silicide layer thinner in thickness than the second silicide layer.

11 Claims, 16 Drawing Sheets

9a···SILICON NITRIDE FILM
10 ···SEMICONDUCTOR SUBSTRATE
101···FIRST TRANSISTOR
102···SECOND TRANSISTOR
13a···FIRST SOURCE LAYER
13b···SECOND SOURCE LAYER
23a···FIRST DRAIN LAYER
23b···SECOND DRAIN LAYER
14a···FIRST SILICIDE LAYER
20a···SECOND SILICIDE LAYER
14b···THIRD SILICIDE LAYER
20b···FOURTH SILICIDE LAYER
5a,5b···GATE INSULATING FILM
6a···FIRST GATE ELECTRODE
6b···SECOND GATE ELECTRODE

FULL SILICIDE REGION

NON-FULL SILICIDE REGION

FULL SILICIDE REGION

NON-FULL SILICIDE REGION

FULL SILICIDE REGION

NON-FULL SILICIDE REGION

FULL SILICIDE REGION

NON-FULL SILICIDE REGION

FULL SILICIDE REGION

NON-FULL SILICIDE REGION

FULL SILICIDE REGION

NON-FULL SILICIDE REGION

FULL SILICIDE REGION

NON-FULL SILICIDE REGION

FULL SILICIDE REGION

NON-FULL SILICIDE REGION

FULL SILICIDE REGION

NON-FULL SILICIDE REGION though 7,427,796 B2

SEMICONDUCTOR DEVICE AND METHOD OF MANUFACTURING A SEMICONDUCTOR DEVICE

CROSS-REFERENCE TO RELATED APPLICATIONS

This application is based upon and claims the benefit of priority from the prior Japanese Patent Applications No. 2004-273849, filed on Sep. 21, 2004, the entire contents of which are incorporated herein by reference.

BACKGROUND OF THE INVENTION

1. Field of the Invention

The present invention relates to a semiconductor device and a method of manufacturing the semiconductor device.

2. Background Art

To enhance the switching speed of semiconductor devices, a silicide layer lower in specific resistance than polysilicon is often formed on the gate electrode. To form the silicide layer On the gate electrode, the gate electrode and a source/drain diffusion layer are first formed on a semiconductor substrate; a metal layer is next deposited on the semiconductor substrate; and the semiconductor substrate is annealed. In this process, thickness of the silicide layer usually depends on the thickness of the metal layer.

There is a recent proposal to form on a common semiconductor substrate both a MOSFET in which the gate electrode is entirely silicided (hereafter called a full silicide MOSFET) and a MOSFET in which the upper part of the gate electrode is locally silicided (hereafter called a non-full silicide MOSFET). Heretofore, a process using photolithography has been used to locally retain a silicon oxide film or other mask material in a desired region such that a relatively thick metal layer deposits in the region for the full silicide MOSFET (hereafter called a full silicide region) while a relatively thin metal layer deposits in the region for the non-full silicide MOSFET (hereafter called a non-full silicide region). In this process, the gate electrode in the full silicide region is entirely silicided whereas the gate electrode in the non-full silicide region is partly silicided only in the top portion thereof. In this manner, the conventional technique locally made the full silicide MOSFET and the non-full silicide MOSFET in different regions on a common semiconductor substrate.

However, removal of the mask material after deposition of the metal layers invites the problem of undesirable etching of sidewall protection films of the gate electrodes and the silicide layer.

Furthermore, since the silicide layer is formed to spread over the source and drain layers of the MOSFETs, the silicide layer on the source and drain layer of the full silicide MOSFET becomes thicker than that of the non-full silicide MOSFET. This may invite junction leakage.

It might be possible to use a process of forming a silicide by exposing the gate electrodes alone. This process, however, cannot form a silicide on the source and drain layer (see Kedzierski et al., "Issues in NiSi-gated FDSOI device integration", IEDM Tech. Dig., 2003, pp. 441-444).

To overcome these problems, here is provided a semiconductor device having transistors that include silicides different in thickness in their gate electrodes in a common substrate and can prevent junction leakage in their source and the drain.

SUMMARY OF THE INVENTION

A semiconductor device according to an embodiment of the present invention comprises a first transistor including: a first source layer and a first drain layer both formed in a surface of a semiconductor substrate; a first silicide layer formed on the first source layer and the first drain layer; a first gate electrode formed on a first gate insulating film, which is formed on the surface of the semiconductor substrate and has a second silicide layer; and a silicon nitride film formed on sidewalls of the first gate electrode;

a second transistor including: a second source layer and a second drain layer both formed in the surface of the semiconductor substrate; a third silicide layer formed on the second source layer and the second drain layer and equal in thickness to the first silicide layer; a second gate electrode formed on a second gate insulating film, which is formed on the surface of the semiconductor substrate and has a fourth silicide layer thinner in thickness than the second silicide layer.

A method of manufacturing a semiconductor device according to an embodiment of the present invention, comprises forming a gate insulating film on a semiconductor substrate; forming a plurality of gate electrodes on the gate insulating film; forming a silicon nitride film on sidewalls of a first of the gate electrodes; forming a silicon oxide film on sidewalls of a second of the gate electrodes, the second gate electrode having no silicon nitride film on sidewalls thereof; depositing a metal layer on the plurality of gate electrodes and the semiconductor substrate; and siliciding at least the tops of the gate electrodes by annealing the semiconductor substrate.

BRIEF DESCRIPTION OF THE DRAWINGS

FIG. 3 is a graph showing the relation between the thickness of the silicon oxide layer 7a and the resistance of the silicide film 20a;

DETAILED DESCRIPTION OF THE INVENTION

Some embodiments of the present invention will now be explained below with reference to the drawings. The embodiments, however, should not be construed to limit the invention in any ways and modes. In the embodiments explained below, the full silicide does not always means that the gate electrode is silicided by 100%, but contemplates that a part thereof may be doped polysilicon. For example, even when the silicide layer in a gate electrode reaches a gate insulating film, a part of the interface between the gate electrode and the gate insulating film may be non-silicided.

First Embodiment

Figure 1A:
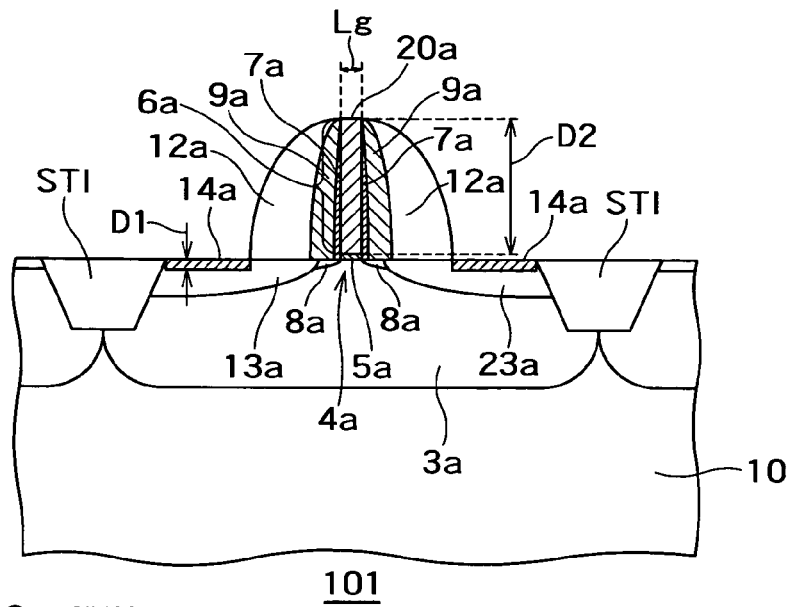
FIG. 1A and FIG. 1B are cross-sectional views of transistors according to the first embodiment of the invention.
Figure 1B:
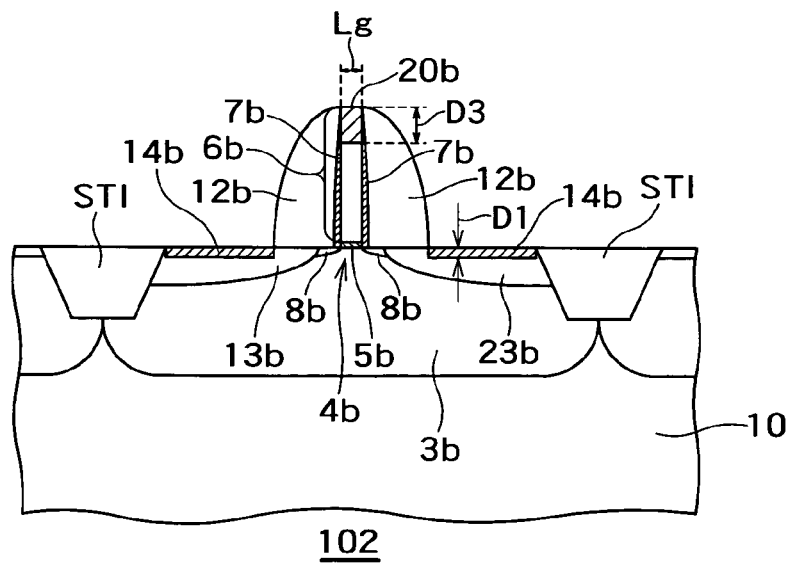

FIG. 1A is a cross-sectional view of a first transistor 101 in a full silicide region of a semiconductor device according to the first embodiment of the invention. FIG. 1B is a cross-sectional view of a second transistor 102 in a non-full silicide region of the semiconductor device according to the first embodiment of the invention. The first transistor 101 and the second transistor 102 are formed on a common semiconductor chip.

The first transistor 101 includes a first source layer 13a, a first drain layer 23a, a first silicide layer 14a, a second silicide layer 20a, a first gate electrode 6a, a silicon oxide film 7a, a silicon nitride film 9a and a silicon oxide film 12a. The second transistor 102 includes a second source layer 13b, a second drain layer 23b, a third silicide layer 14b, a fourth silicide layer 20b, a second gate electrode 6b, a silicon oxide film 7b and a silicon oxide film 12b.

In the first transistor 101, the first source layer 13a and the first drain layer 23a are formed in a well diffusion layer 3a formed on the surface of a p-type or n-type silicon substrate 10. The first source layer 13a and the first drain layer 23a may be either of p-type layers or of n-type layers. To prevent a short-channel effect, an extension layer 8a is formed near a channel region 4a between the first source layer 13a and the first drain layer 23a. The extension layer 8a is of the same conduction type as that of the first source layer 13a and the first drain layer 23a.

The first silicide layer 14a is formed on the first source layer 13a and the first drain layer 23a. The first silicide layer 14a may be made of nickel silicide, for example, and its thickness is D1. Considering that the depth of the first source layer 13a and the first drain layer 23a is equal to or less than 80 nm, the thickness D1 is preset equal to or less than 30 nm to prevent the junction leak.

A gate insulating film 5a is formed on the surface of the channel region 4a. The gate electrode 6a is formed on the gate insulating film 5a and thereby isolated from the channel region 4a. The gate electrode 6a may be made of nickel silicide, for example. The gate electrode 6a is preferably silicided entirely. At least the thickness D2 of the second silicide layer 20a is thicker than the thickness D3 of the second silicide layer 20b in the second transistor 102. Therefore, the first transistor 101 is lower in gate resistance than the second transistor 102. As a result, the first transistor 101 is enhanced in switching speed. Typically, the first transistor 101 is used in an analog circuit region required to be low in gate resistance, logic circuit region required to be high in switching speed, or SRAM region.

The silicon oxide film 7a is formed on the sidewall of the gate electrode 6a. The silicon nitride film 9a is formed on the sidewall of the gate electrode 6a to lie adjacent to the silicon oxide film 7a. The silicon oxide film 12a is formed on the sidewall of the gate electrode 6a to cover the silicon nitride film 9a.

The silicon nitride film 9a formed on the sidewall of the gate electrode 6a promotes silicidation of the gate electrode 6a. Conditions of full silicidation of the gate electrode 6a will be explained later.

In the second transistor 102, the second source layer 13b and the second drain layer 23b are formed in a well diffusion layer 3b formed on the surface of the silicon substrate 10. The second source layer 13b and the second drain layer 23b may be either p-type layers or n-type layers. An extension layer 8b is formed near a channel region 4b. The extension layer 8b is of the same conduction type as that of the second source layer 13b and the second drain layer 23b.

The third silicide layer 14b is formed on the second source layer 13b and the second drain layer 23b. The third silicide layer 14b may be made of nickel silicide, for example. Thickness of the third silicide layer 14b is D1 equally to the thickness of the first silicide layer 14a.

A gate insulating film 5b is formed on the surface of the channel region 4b. The gate electrode 6b is formed on the gate insulating film 5b and thereby isolated from the channel region 4b. An upper portion of the gate electrode 6b, the fourth silicide layer 20b is formed. The fourth silicide layer 20b may be made of nickel silicide, for example. The lower part of the gate electrode 6b below the fourth silicide layer 20b is made of doped polysilicon. As already explained, the thickness D3 of the fourth silicide layer 20b is thinner than the thickness D2 of the second silicide layer 20b Since the fourth silicide layer 20b does not reach the gate the gate insulating film 5b, relatively high reliability of the gate insulating film 5b can be maintained. Typically, the second transistor 102 is used in a DRAM required to be highly reliable, or in a device directly incorporating an existing circuit region.

The silicon oxide film 7b is formed on the sidewall of the gate electrode 6b. Furthermore, the silicon oxide film 12b is formed on the sidewall of the gate electrode 6a to cover the silicon oxide film 7b. Since the second transistor 102 does includes no silicon nitride film on the sidewall of the gate electrode 6b, the upper part alone of the gate electrode 6b is silicided.

Figure 2A:
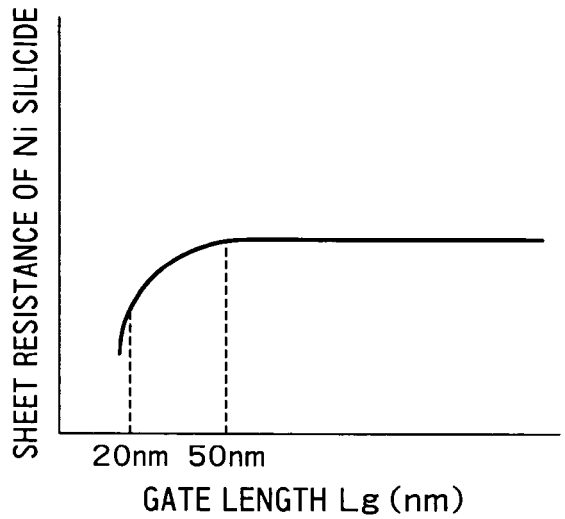
FIG. 2A is a graph showing the sheet resistance of the second silicide layer 20a relative to the gate length Lg of the first transistor 101.
Figure 2B:
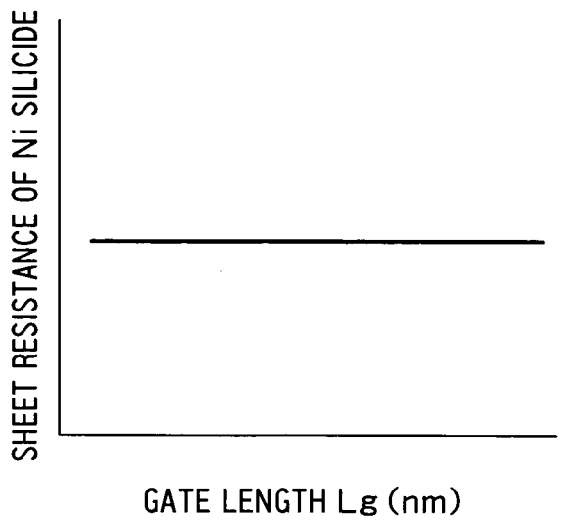
FIG. 2B is a graph showing the sheet resistance of the fourth silicide layer 20b relative to the gate length Lg of the second transistor 102.

FIG. 2A is a graph showing the sheet resistance of the second silicide layer 20a relative to the gate length Lg of the first transistor 101. FIG. 2B is a graph showing the sheet resistance of the fourth silicide layer 20b relative to the gate length Lg of the second transistor 102.

In case the gate length Lg is larger than 50 nm, the second silicide layer 20a and the fourth silicide layer 20b are approximately equal in sheet resistance. When the gate length Lg decreases to or below 50 nm as shown in FIG. 2A, the sheet resistance of the second silicide layer 20a begins to lower. This is because, in case the gate length Lg of the gate electrode 6a is short, the silicon nitride film 9a on the sidewall of the gate electrode 6a promotes silicidation of the gate electrode 6a and the thickness of the second silicide layer 20a increases accordingly. Hereafter, this is called "reverse narrow line effect".

In case the gate length Lg is longer than 50 nm, thickness of the silicide films 20a and 20b depends upon a thickness of a metal layer deposited upon the gate electrodes 6a and 6b in order to form the silicide films 20a and 20b. However, as the gate length Lg decreases to or below 50 nm, silicidation from the sidewall portion of the gate electrode 6a becomes salient.

Therefore, even when the sputtering thickness of the metal layer (for example, thickness of a nickel layer) is constant, the silicon nitride film 9a formed on the sidewall of the gate electrode 6a may change the thickness of the silicide film 20a. Note that the silicon nitride film does not exist on the gate electrode 6b. Therefore, the reverse narrow line effect does not occur in the second transistor 102 as shown in FIG. 2B.

As the gate length Lg decreases to or below 20 nm, the gate electrode 6a is entirely silicided (full silicidation).

From the above discussion, it is apparent the gate length Lg of the gate electrode 6a is preferably equal to or less than 50 nm to form the second silicide layer 20a thicker than the fourth silicide layer 20b. Further, for full silicidation of the gate electrode 6a, the gate length of the gate electrode 6a is preferably equal to or less than 20 nm.

Figure 3:
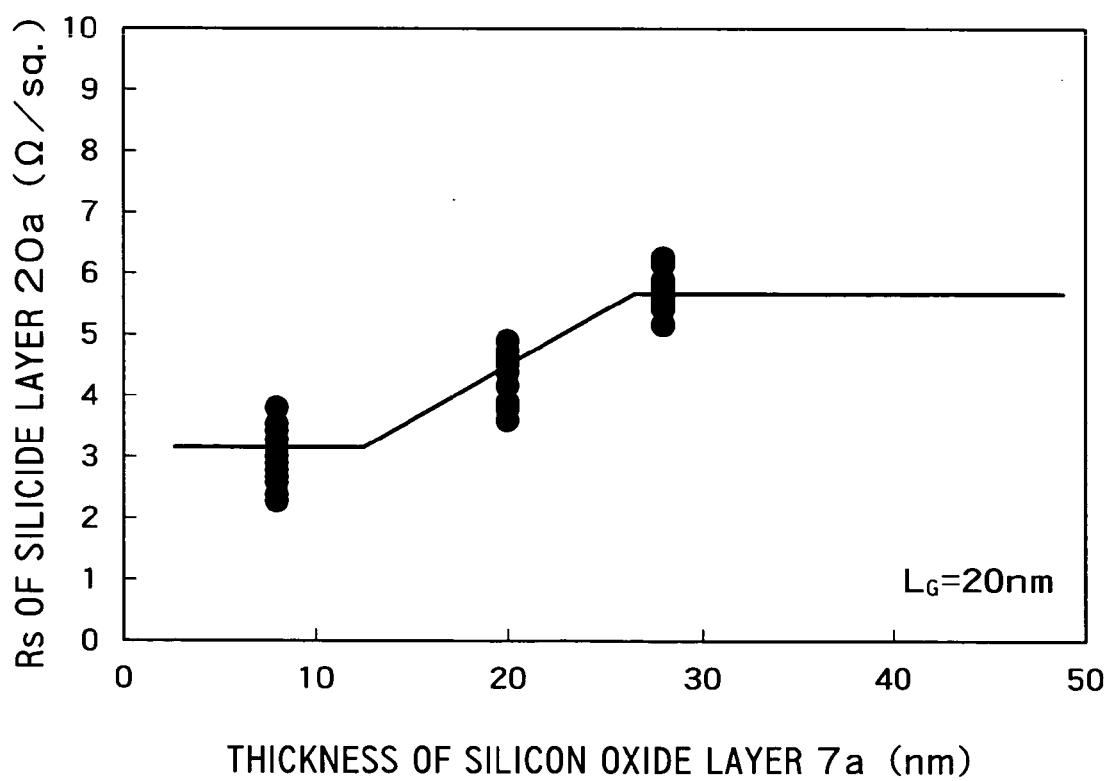

FIG. 3 is a graph showing the relation between the thickness of the silicon oxide layer 7a and the resistance of the silicide film 20a. Here, the gate length Lg is 20 nm. Thickness of the silicon oxide film 7a is the thickness formed on the sidewall of the gate electrode 6a and the thickness of near the interface between the gate electrode 6a and the gate insulating film 5a.

Between the gate electrode 6a and the silicon nitride film 9a, the silicon oxide film 7a intervenes. The silicon oxide film 7a is formed to prevent concentration of the electric field to the end portion of the gate insulating film 5a, i.e. to enhance the reliability of the fist transistor 101. However, if the silicon oxide film 7a is excessively thick, distance between the gate electrode 6a and the silicon nitride film 9a increases, and the reverse narrow line effect does not take place.

As shown in FIG. 3, in case the thickness of the silicon oxide film 7a is larger than 28 nm, resistance of the silicide film 20a is relatively high. This means that the reverse narrow line effect has not occurred. As the thickness of the silicon oxide film 7a decreases to or below 28 nm, the reverse narrow line effect occurs, and the resistance of the silicide film 20a lowers. When the thickness of the silicon oxide film 7a decreases to or below 10 nm approximately, resistance of the silicide film 20a stabilizes in a low level. This means that the gate electrode 6a has been fully silicided.

From the above discussion, it is apparent that the thickness of the silicon oxide film 7a is preferably equal to or smaller than 20 nm to bring about the reverse narrow line effect. Furthermore, to fully silicide the gate electrode 6a, thickness of the silicon oxide film 7a is preferably equal to or less than 10 nm approximately.

When the silicon nitride film 9a becomes less than 8 nm, the impact of the silicon nitride film on the reverse narrow line effect becomes small. Therefore, the thickness of the silicon nitride film more than 8 nm is required.

Since the first embodiment need not deposit a thick metal layer on the transistor in the full silicide region, it has silicide layers equal in thickness on the source and drain layers in both full silicide and non-full silicide regions. Therefore, the junction leak in the source and drain layers can be prevented. Furthermore, the first embodiment has silicide layers different in thickness on the gate electrodes in the full silicide region and the non-full silicide region. Therefore, it can form both the full silicide MOSFET enhanced in switching speed and the non-full silicide MOSFET having high reliability on the common substrate.

In addition, since the thickness of the silicide layer of the gate electrode does not depend on the thickness of a metal layer deposited, the first embodiment need not deposit metal layers on the full silicide region and the non-full silicide region in different manufacturing steps unlike the conventional technique, and needs no step of removing a mask, which is sequent to deposition of a metal layer. Therefore, the first embodiment can make the manufacturing process easier and can enhance the performance of the transistors.

FIGS. 4A through 13B are cross-sectional views of the semiconductor device according to the first embodiment of the invention, which show a flow of its manufacturing process. FIGS. 4A, 5A, 6A, 7A, 8A, 9A, 10A, 11A, 12A and 13A are cross-sectional views of the full silicide region. FIGS. 4B, 5B, 6B, 7B, 8B, 9B, 10B, 11B, 12B and 13B are cross-sectional views of the non-full silicide region.

Figure 4A:
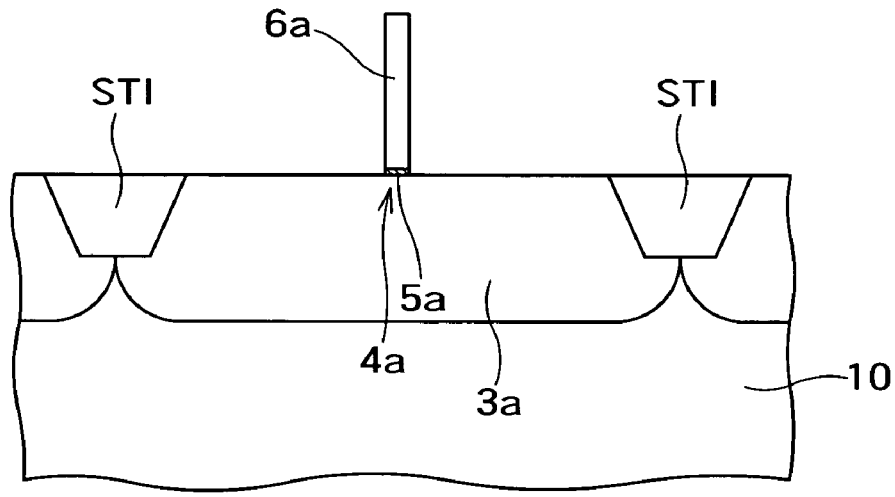
FIGS. 4A and 4B are cross-sectional views of the semiconductor device which show its manufacturing process according to the first embodiment of the invention.
Figure 4B:
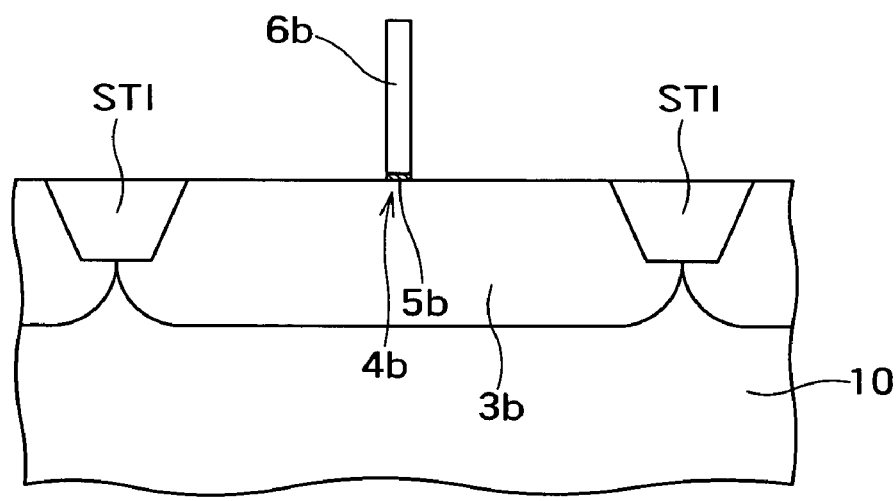
Figure 5A:
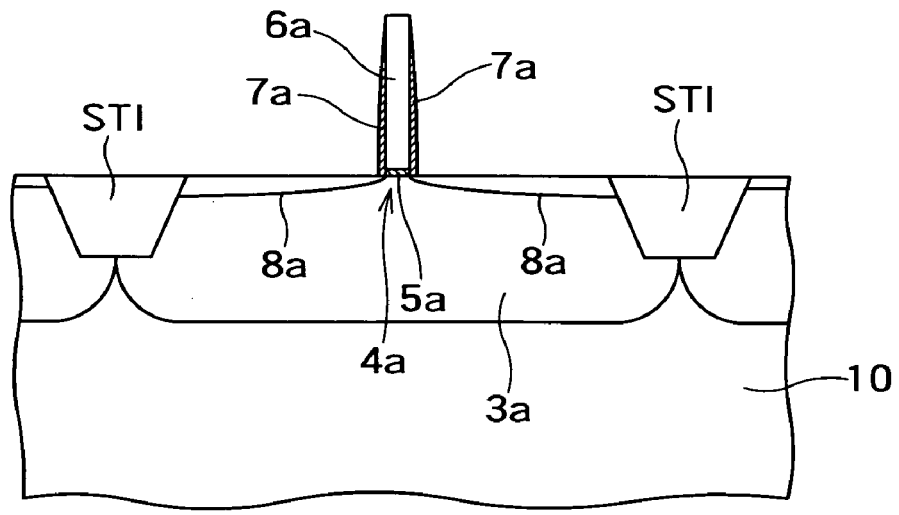
FIGS. 5A and 5B are cross-sectional views showing the manufacturing process following FIGS. 4A and 4B.
Figure 5B:
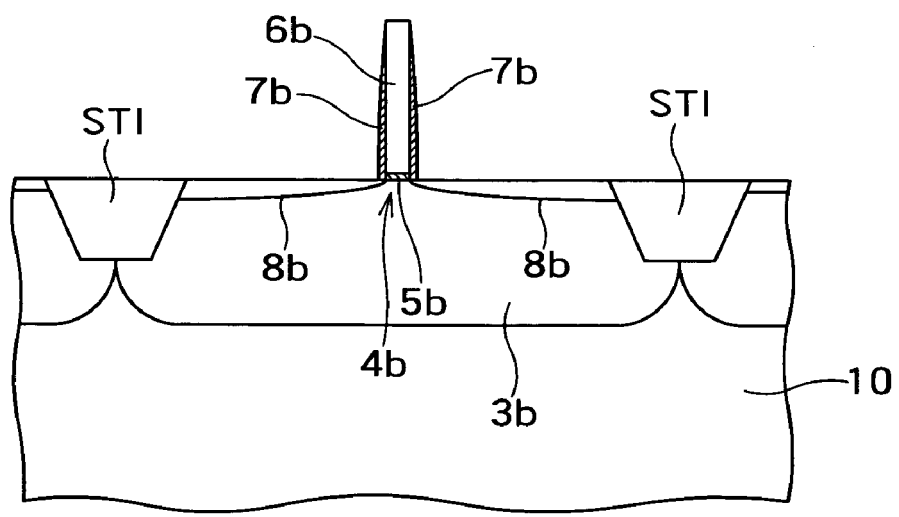

As shown in FIGS. 4A and 4B, a 200~350 nm thick Shallow Trench Isolation (STI) is first formed in a p-type or n-type silicon substrate 10 by a device-isolating technique. Thereafter, a silicon oxide film (not shown), equal to or thinner than 20 nm, is formed on the surface of the silicon substrate 10.

After that, to form the well regions 3a, 3b and the channel regions 4a, 4b, injection of impurities and activating RTA (Rapid Thermal Annealing) follow. Typically, for impurity injection into n-type wells, phosphorus is implanted by ion implantation under the condition of concentration $3.0*13$ $cm^{-2}$ and energy 500 keV. For impurity implantation into n-type channel regions, boron is implanted by ion implantation under the condition of concentration $1.5*13$ $cm^{-2}$ and energy 10 keV. For impurity implantation in p-type wells, boron is injected by impurity implantation under the condition of concentration $2.0*13$ $cm^{-2}$ and energy 260 keV. For impurity implantation into p-type channel regions, arsenic is injected by ion injection under the condition of concentration $1.0*13$ $cm^{-2}$ and energy 80 keV. Thereafter, the previously formed silicon oxide film (not shown) is removed.

After that, 0.5 nm~6 nm thick gate insulating films 5a and 5b are formed by LPCVD (Low Pressure Chemical Vapor Deposition). On the gate insulating films 5a and 5b, polysilicon or polysilicon germanium is deposited to a thickness of 50~200 nm, followed by photolithography, X ray lithography or electron beam lithography for patterning of 10~150 nm gate length. In addition, polysilicon or polysilicon germanium is partly removed by RIE (Reactive Ion Etching). Through these steps, the gate electrodes 6a and 6b having a gate length Lg equal to or less than 50 nm are obtained. The gate insulating films 5a and 5b may be any of silicon oxide films ($SiO_2$), silicon oxide nitride films (SiON), silicon nitride films (SiN) and high dielectric films (such as $Ta_2O_3$).

As shown in FIGS. 5A and 5B, 1~6 nm thick silicon oxide films are formed on sidewalls of the gate electrodes 6a and 6b by thermal oxidation. Thereafter, a silicon oxide film is deposited by LPCVD. Further through an etch-back process by RIE, silicon oxide films 7a and 7b of a thickness equal to or less than 10 nm are obtained. The silicon oxide films 7a and 7b are used as offset spacers upon forming the extension layers 8a and 8b.

After that, the extension layers 8a and 8b are formed. Typically, for impurity implantation into the n-type extension layer, arsenic is implanted by ion implantation under the condition of concentration from $5.0*10^{14}$ $cm^{-2}$ to $1.5*10^{15}$ $cm^{-2}$ and energy 1~5 keV. For impurity injection into the p-type extension layer, $BF_2$ is injected by ion injection under the condition of concentration from $5.0*10^{14}$ $cm^{-2}$ to $1.5*10^{15}$ $cm^{-2}$ and energy 1~3 keV. The extension layers 8a and 8b are formed in self-alignment via the silicon oxide films 7a and 7b as offset spacers.

Figure 6A:
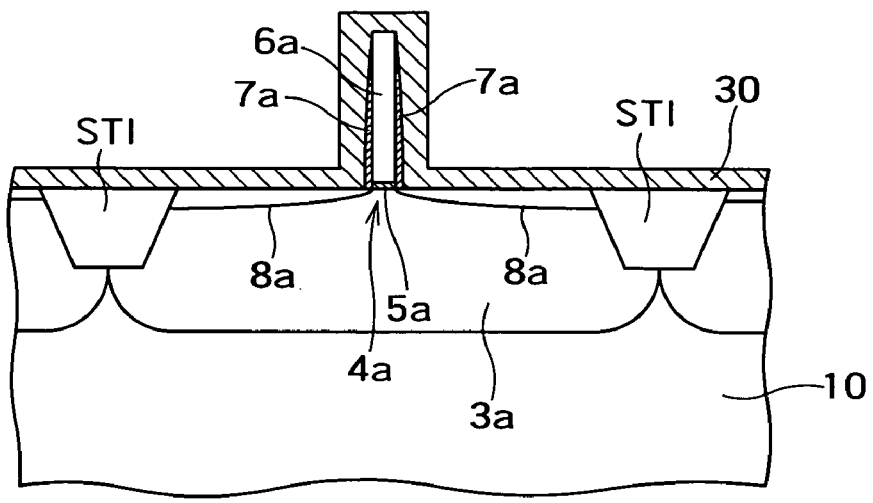
FIGS. 6A and 6B are cross-sectional views showing the manufacturing process following FIGS. 5A and 5B.
Figure 6B:
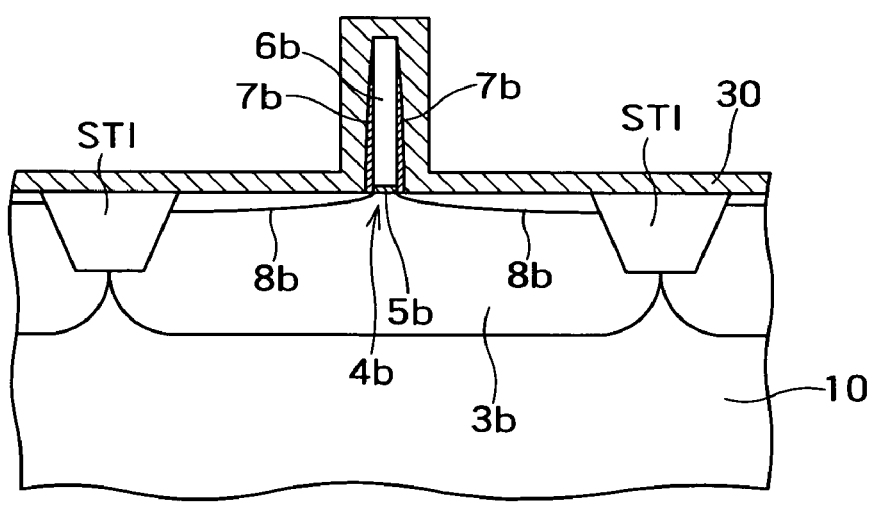
Figure 7A:
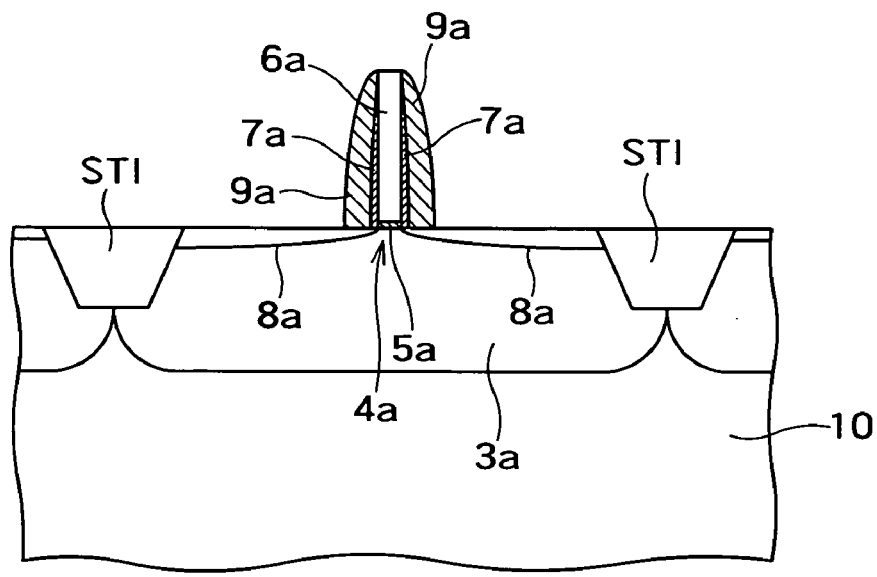
FIGS. 7A and 7B are cross-sectional views showing the manufacturing process following FIGS. 6A and 6B.
Figure 7B:
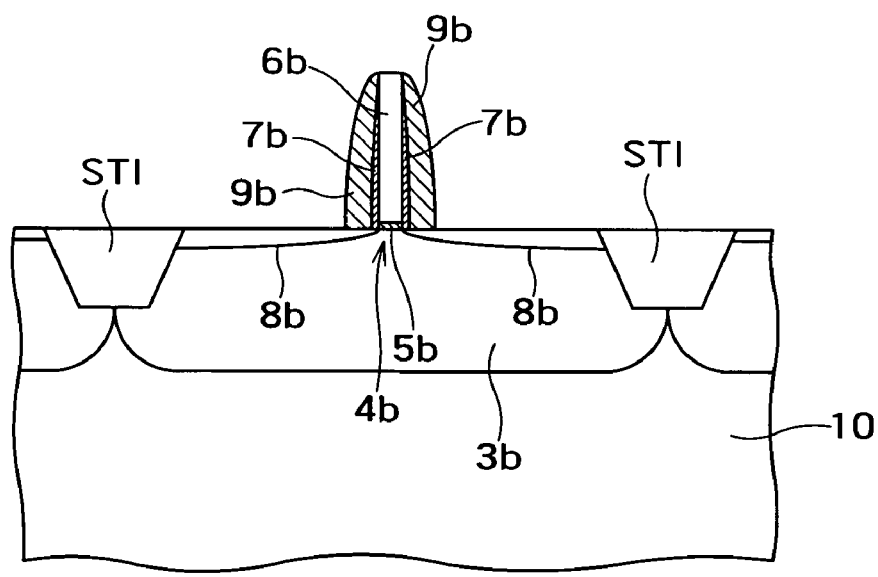

As shown in FIGS. 6A and 6B, a silicon nitride film 30 is next deposited. Subsequently, as shown in FIGS. 7A and 7B, the silicon nitride film 30 is processed by anisotropic etching by RIE to retain silicon nitride films 9a and 9b on sidewalls of the gate electrodes 6a and 6b.

Figure 8A:
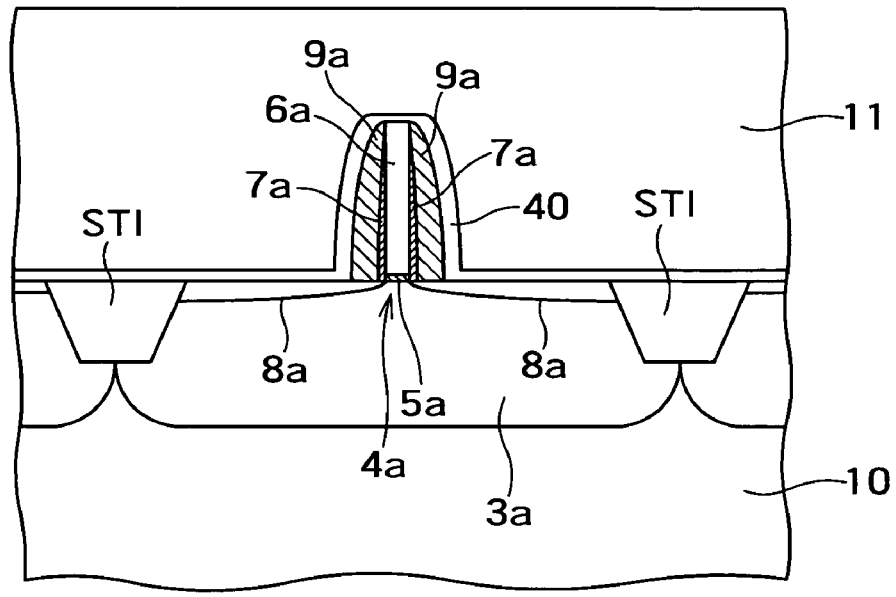
FIGS. 8A and 8B are cross-sectional views showing the manufacturing process following FIGS. 7A and 7B.
Figure 8B:
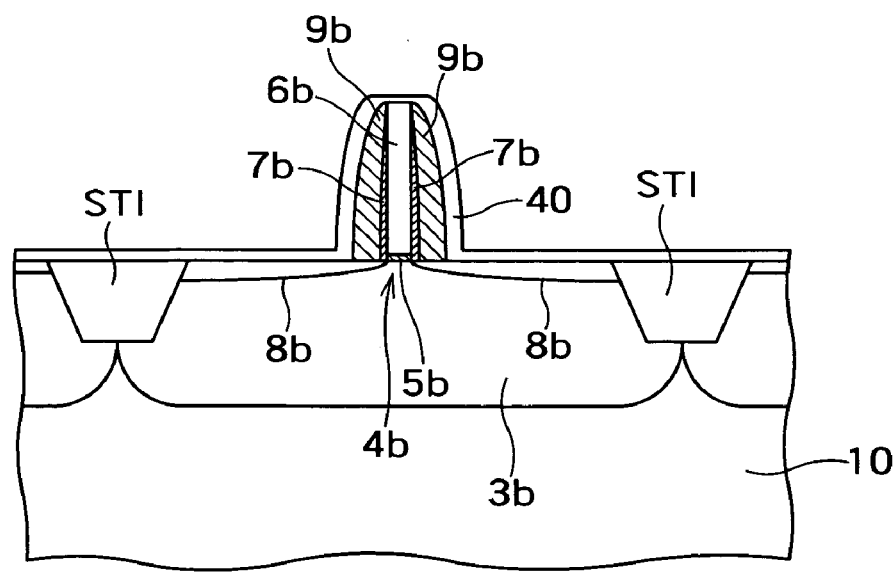

As shown in FIGS. 8A and 8B, a TEOS film 40 is next deposited, and photo resist 11 is coated. Subsequently, the photo resist 11 is removed only from the non-full silicide region while retaining it in the full silicide region for patterning.

Figure 9A:
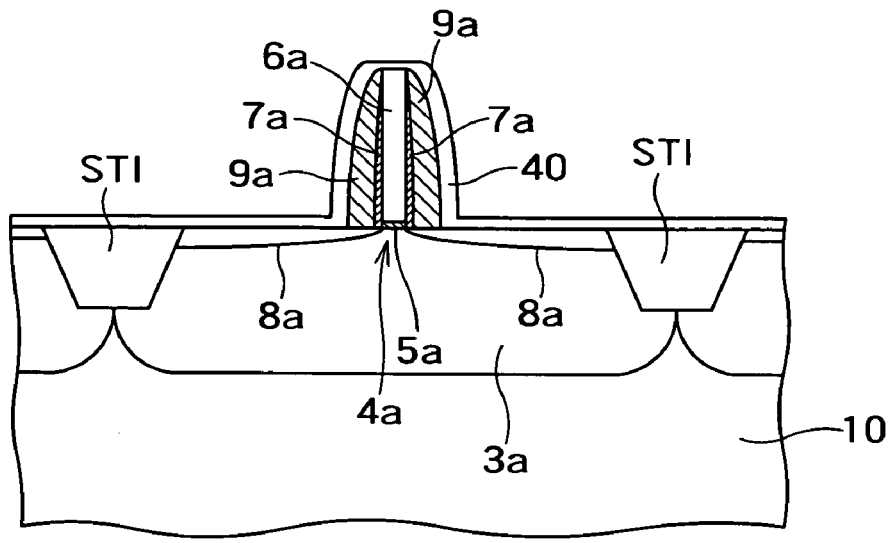
FIGS. 9A and 9B are cross-sectional views showing the manufacturing process following FIGS. 8A and 8B.
Figure 9B:
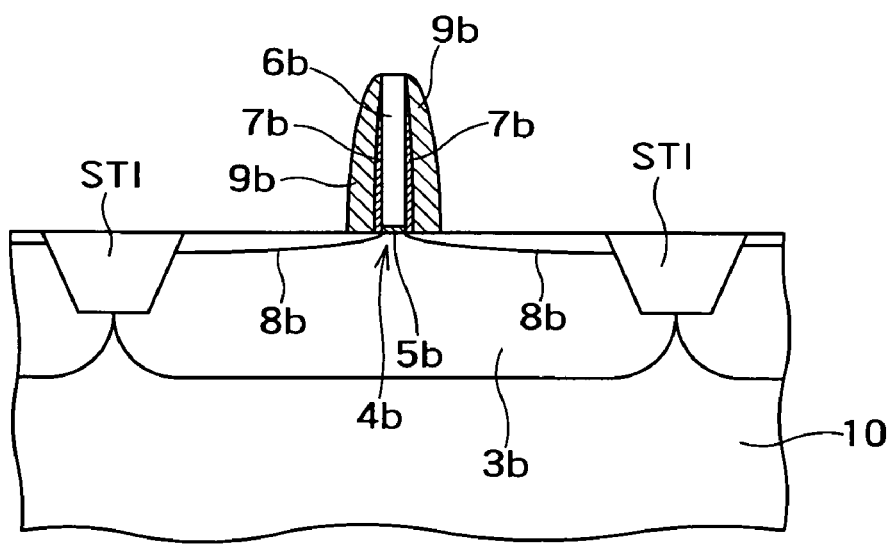

As shown in FIGS. 9A and 9B, the TEOS film 40 in the non-full silicide region is removed by etching, and the resist is removed thereafter.

Figure 10A:
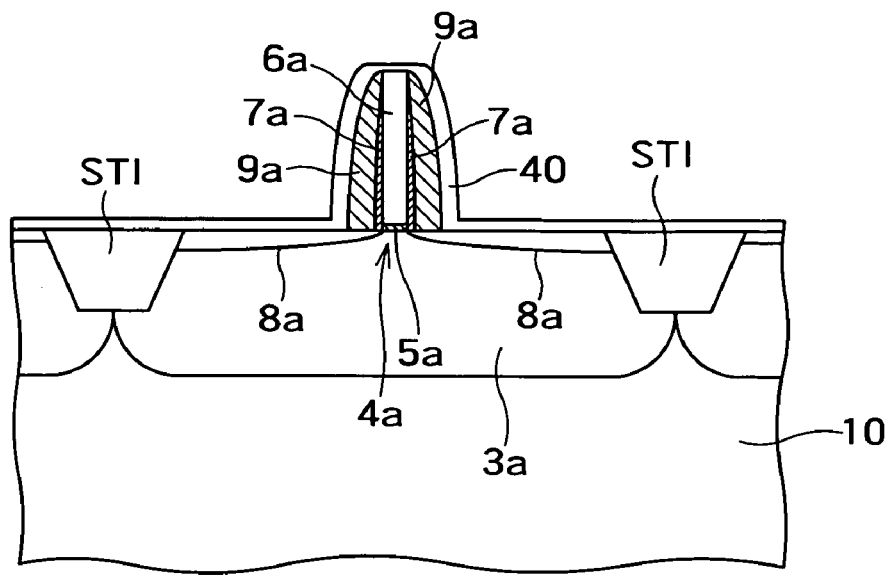
FIGS. 10A and 10B are cross-sectional views showing the manufacturing process following FIGS. 9A and 9B.
Figure 10B:
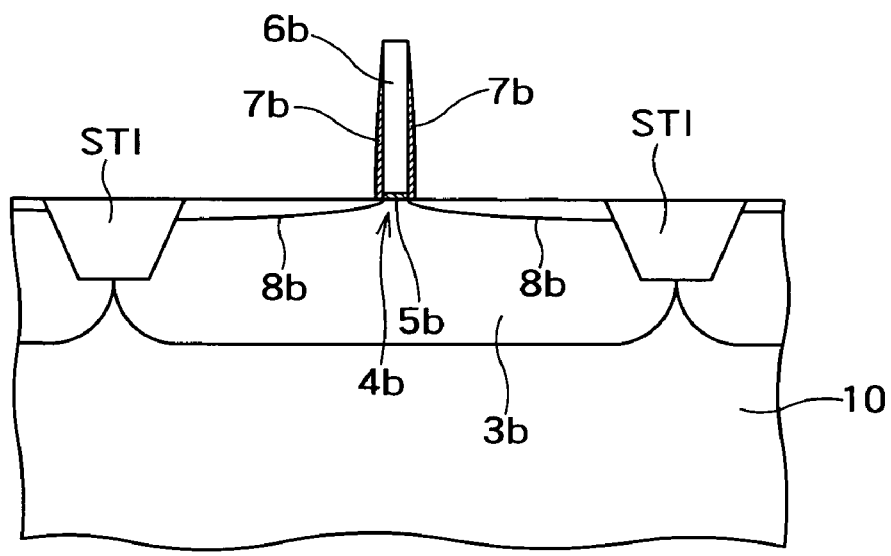

As shown in FIGS. 10A and 10B, by using the TEOS film 40 covering the full silicide region as a mask, the silicon nitride film 9b in the non-full silicide region is removed by etching. Typically, etching of the silicon nitride film 9b is attained by exposing the silicon nitride film 9b to hot phosphoric acid solution heated to 160° C.

Figure 11A:
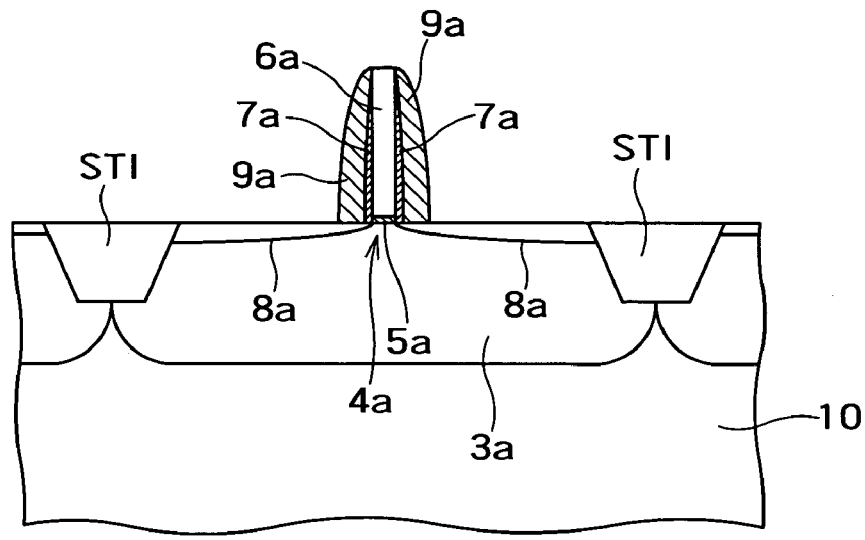
FIGS. 11A and 11B are cross-sectional views showing the manufacturing process following FIGS. 10A and 10B.
Figure 11B:
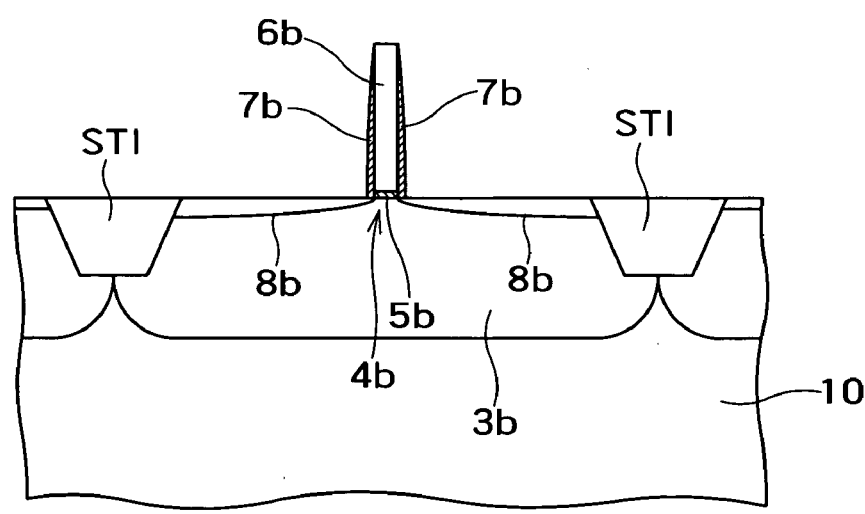

As shown in FIGS. 11A and 11B, the TEOS film 40 is next removed by dilute fluoric acid. As such, the silicon nitride film 9a is retained on the sidewall of the gate electrode 6a in the full silicide region whereas the silicon nitride film 9b is removed from the sidewall of the gate electrode 6b in the non-full silicide region.

Figure 12A:
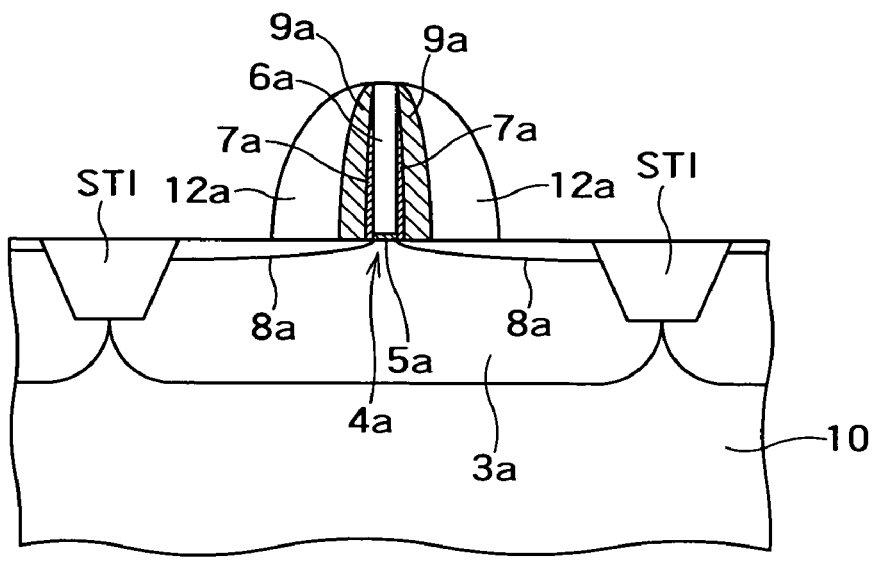
FIGS. 12A and 12B are cross-sectional views showing the manufacturing process following FIGS. 11A and 11B.
Figure 12B:
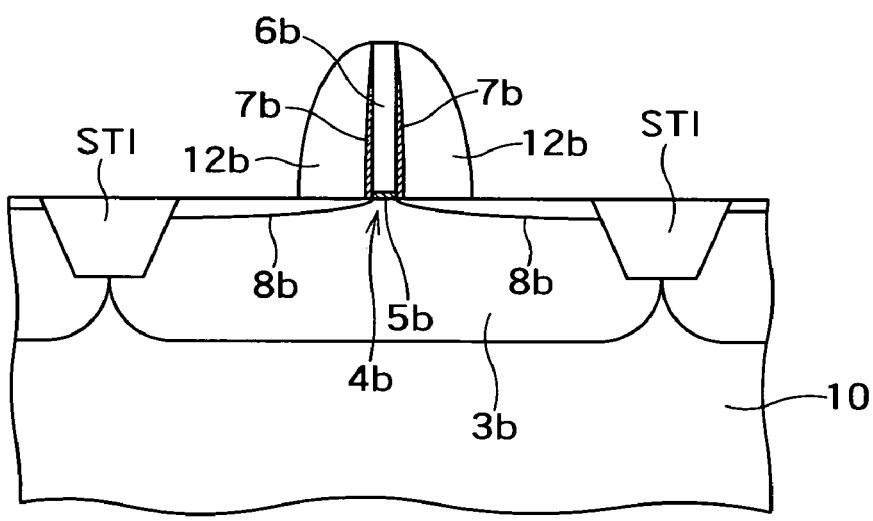

As shown in FIGS. 12A and 12B, silicon oxide films 12a and 12b are next formed additionally on sidewalls of the gate electrodes 6a and 6b. The silicon oxide films 12a and 12b may have a double-layered structure. In the full silicide region, the silicon oxide films 12a and 12b cover the silicon nitride film 9a.

The silicon oxide films 12a and 12b may be a single-layered TEOS layer. Further, the silicon oxide films 12a and 12b may be a double-layered structure. For example, the silicon oxide films 12a and 12b may have TEOS as liner films and have silicon nitride films outside the liner films. Alternatively, the silicon oxide films 12a and 12b may have a triple-layered structure. For example, the silicon oxide films 12a and 12b may have TEOS as liner films, silicon nitride films outside the liner films, and silicon oxide films outside the silicon nitride films. Alternatively, the silicon oxide films 12a and 12b may have a structure including four or more layers. Thus, the silicon oxide films 12a and 12b may be any desired films including silicon oxide films as their base layers.

Figure 13A:
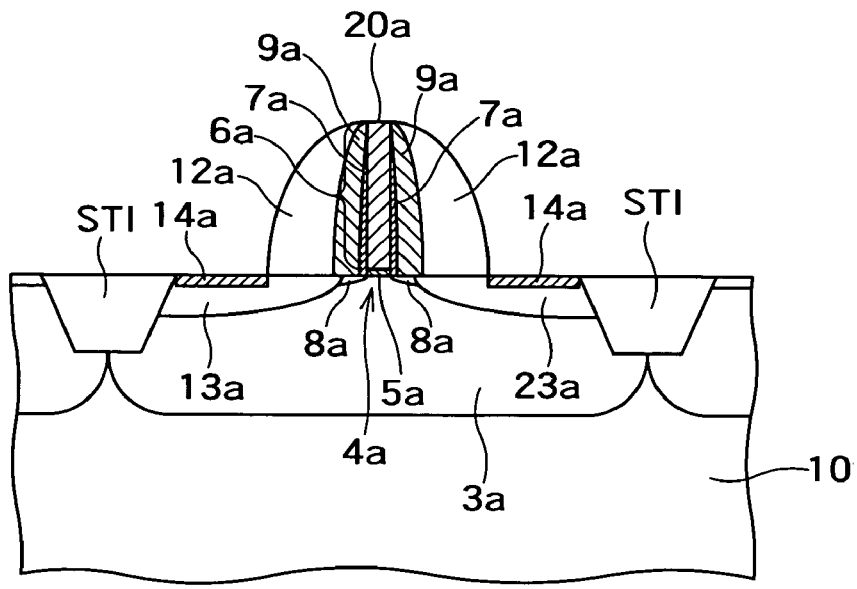
FIGS. 13A and 13B are cross-sectional views showing the manufacturing process following FIGS. 12A and 12B.
Figure 13B:
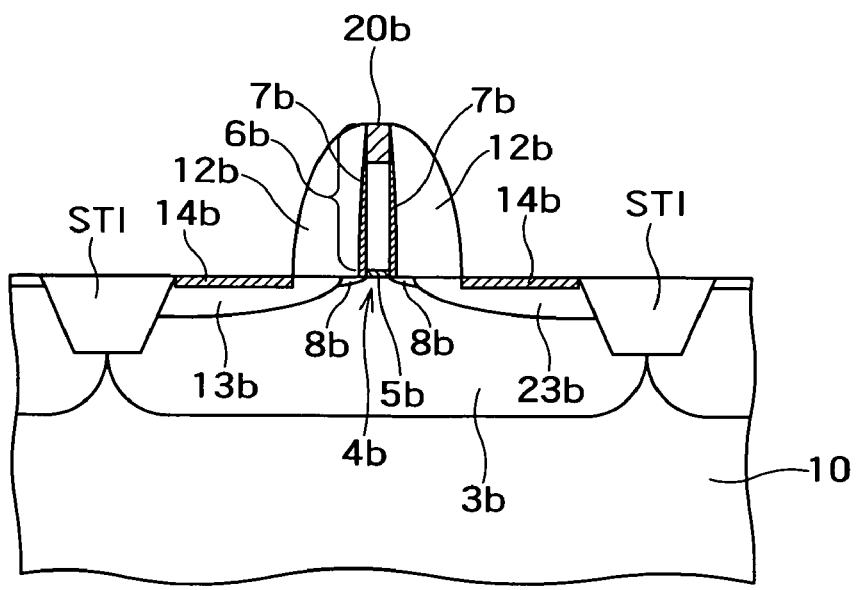

As shown in FIGS. 13A and 13B, the first source layers 13a, 23a and the second drain layers 13b, 23b are next formed. These source and drain layers 13a, 23a, 13b and 23b are next activated by RTA.

In the next step, natural oxide films are removed by treatment using hydrofluoric acid, and a nickel layer is formed uniformly on the surface of the silicon substrate 10. Thereafter, RTA of 400~500° C. for silicidation is carried out. As a result, surfaces of the source and drain layers 13a, 23a, 13b, 23b and surfaces of the gate electrodes 6a, 6b are silicided. Subsequently, the substrate is exposed to a mixed solution of sulfuric acid and hydrogen peroxide solution to remove nickel not having reacted. A step of depositing a titanium nitride (TiN) film may be added after the sputtering of the nickel layer. Alternatively, a two-step annealing process may be carried out, which first carries out low temperature RTA of 250~400° C., next exposes the substrate to the mixed solution of sulfuric acid and hydrogen peroxide solution, and thereafter again carries out RTA of 400~500° C. to lower the sheet resistance.

As a result of this silicidation, the first to fourth silicide layers 14a, 14b, 20a and 20b are obtained. In this process, in the full silicide region, since the silicon nitride film 9a exists on the sidewall of the gate electrode 6a, the second silicide layer 20a in the gate electrode 6a became thick because of the reverse narrow line effect. When the second silicide layer 20a reaches the gate insulating film 5a, the first transistor 101 becomes a full silicide MOSFET. Although the 1~10 nm thick silicon oxide film 7a intervenes between the gate electrode 6a and the silicon nitride film 9a, it is thin as shown in FIG. 3 and does not function to prevent the reverse narrow line effect.

On the other hand, in the non-full silicide region, there is no silicon nitride film near the gate electrode 6b. Therefore, the fourth silicide layer 20b in the gate electrode 6b is deposited relatively thin. As a result, the second transistor 102 becomes a non-full silicide MOSFET.

Before the step of silicidation, silicon may be epitaxially grown on the source and drain layers 13a, 23a, 13b and 23b. Alternatively, silicon germanium may be epitaxially grown on the source and drain layers 13a, 23a, 13b and 23b.

After that, a protection film (not shown) is deposited to protect the first and second silicide layers 14a, 14b. Furthermore, an inter-layer film (not shown) is deposited on the protection film. When contact holes are formed, the inter-layer film is partly removed by RIE. In this process, the protection film protects the first and second silicide layers 14a, 14b, and prevents junction leak that otherwise occurs due to excavation of the substrate by RIE for the source and drain layers 13a, 23a, 13b and 23b. Therefore, the protection film is made of a material having higher selectivity than the inter-layer film.

After contact holes are formed, titanium (Ti) or titanium nitride (TiN) is deposited as a barrier metal, and tungsten (W) is deposited further. Finally, metal wiring is formed, and the semiconductor device is completed.

The manufacturing method according to the instant embodiment can easily manufacture a semiconductor device having silicide layers equal in thickness on the source and drain layers in both the full silicide region and the non-full silicide region and having silicide layers equal in thickness on the gate electrodes in both the full silicide region and the non-full silicide region on a common substrate.

A modified method of manufacturing the semiconductor substrate according to the embodiment is next explained below. After the steps shown in FIGS. 4A through 6B, a TEOS film is deposited. After that, the TEOS film is removed only from the non-full silicide region by photolithography and RIE or wet etching. Then, under the existence of the TEOS film retained in the full silicide region as a mask, the silicon nitride film 30 is entirely removed from the non-full silicide region by etching using hot phosphoric acid solution heated to 160° C. Then, the non-full silicide region is covered by photo resist, the TEOS film is removed by treatment using fluoric acid, and the silicon nitride film 30 in the full silicide region is locally removed by anisotropic etching. As a result, the configuration shown in FIGS. 11A and 11B can be obtained.

Second Embodiment

Figure 14A:
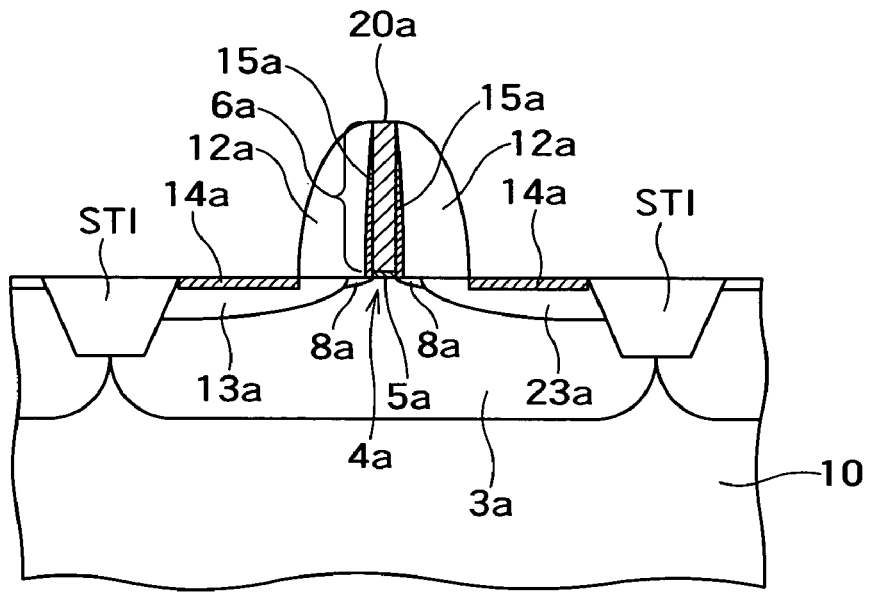
FIG. 14A and FIG. 14B are cross-sectional views of transistors according to the second embodiment of the invention.
Figure 14B:
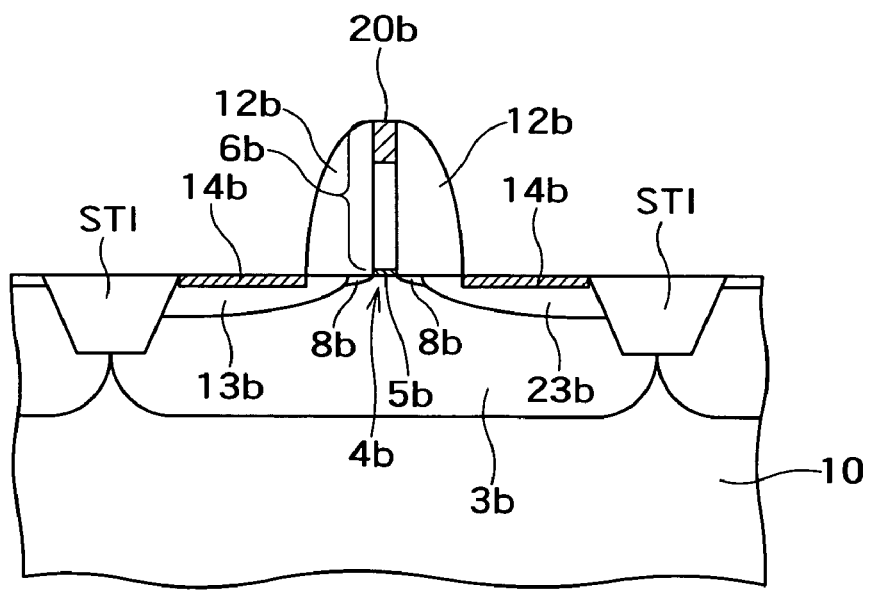

FIG. 14A is a cross-sectional view of the first transistor 101 in the full silicide region of a semiconductor device according to the second embodiment of the invention. FIG. 14B is a cross-sectional view of the second transistor 102 in the non-full silicide region of the semiconductor device according to the second embodiment.

The second embodiment is different from the first embodiment in the use of a silicon nitride film 15a as an offset spacer. As already explained, the first embodiment includes the silicon oxide film 7a as the offset spacer, and includes the silicon nitride film 9a to cover the silicon oxide film 7a. In the second embodiment, however, since the offset spacer itself serves as the silicon nitride film 15a, the silicon oxide film 7a need not be formed.

The silicon nitride film 15a may be formed on the sidewall of the gate electrode 6a in direct contact therewith, or via a natural oxide film (not shown) that is usually formed on the surface of the gate electrode 6a.

In the second embodiment, the silicon nitride film 15a is formed only on the gate electrode 6a in the full silicide region. Therefore, the second silicide layer 20a is formed thicker than the fourth silicide layer 20b. As a result, the second embodiment assures the same effects as those of the first embodiment.

Figure 15A:
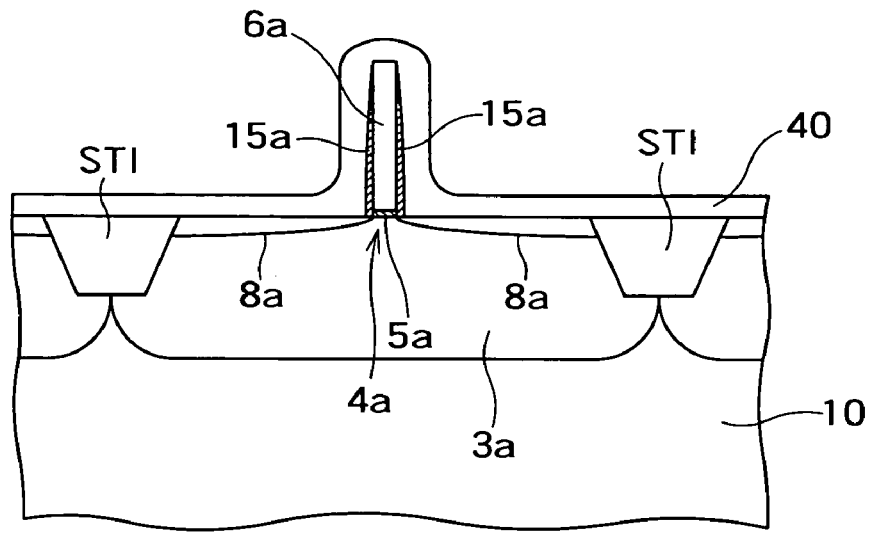
FIGS. 15A and 15B are cross-sectional views of the semiconductor device which show its manufacturing process according to the second embodiment of the invention.
Figure 15B:
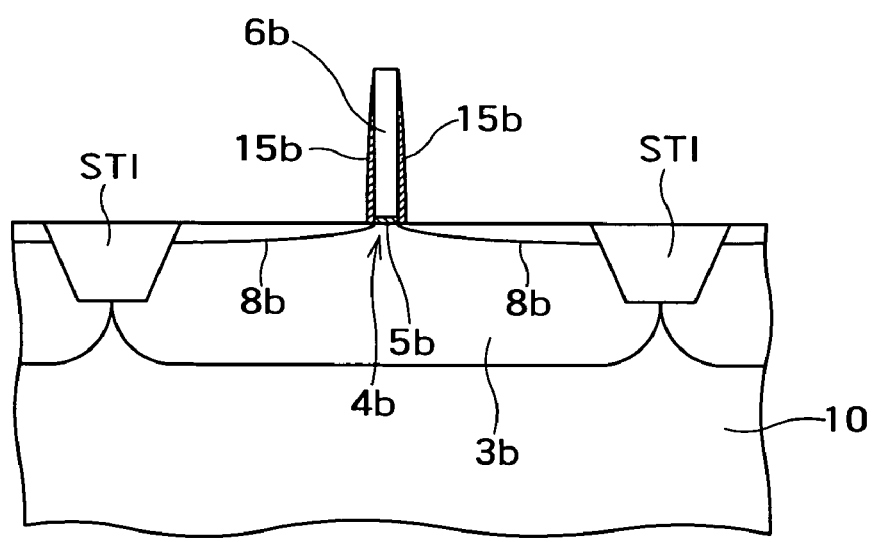
Figure 16A:
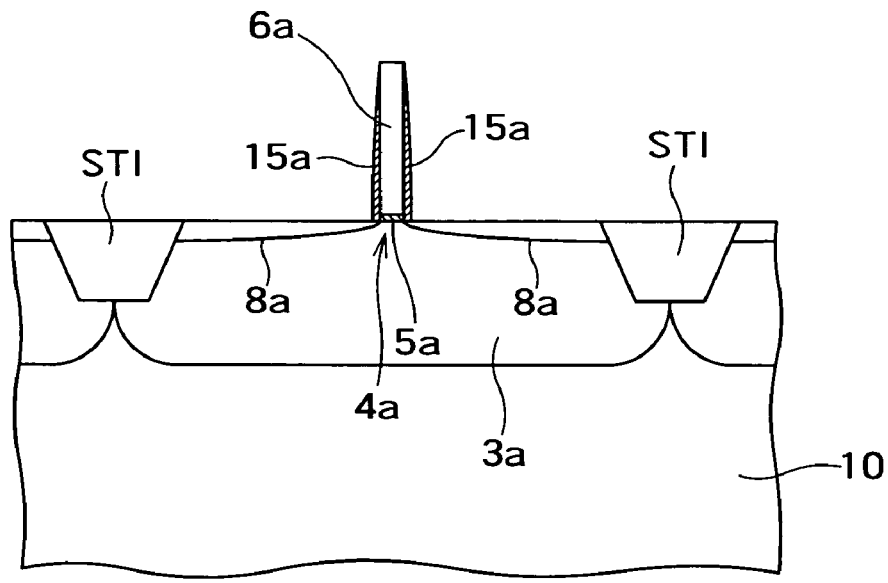
FIGS. 16A and 16B are cross-sectional views showing the manufacturing process following FIGS. 15A and 15B.
Figure 16B:
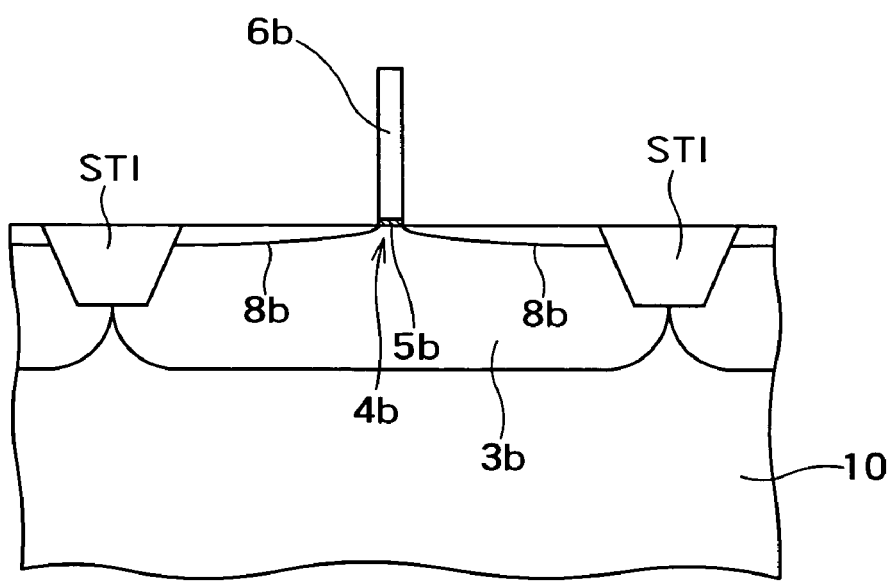

FIGS. 15A through 16B are cross-sectional views of the semiconductor device according to the second embodiment, which show a flow of its manufacturing method. FIGS. 15A and 16A are cross-sectional views of the full silicide region. FIGS. 15B and 16B are cross-sectional views of the non-full silicide region.

The gate electrodes 6a and 6b are formed by the method shown in FIGS. 4A and 4B. As shown in FIGS. 15A and 15B, the silicon nitride films 15a and 15b are next formed on sidewalls of the gate electrodes 6a ad 6b. The silicon nitride films 15a and 15b function as offset spacers when the extension layers 8a and 8b are formed. After the extension layers 8a and 8b are formed, the TEOS film 40 is deposited on the silicon substrate 10. There follow photolithography and RIE or wet etching to retain the TEOS film 40 in the full silicide region and expose the non-full silicide region. Subsequently, the silicon nitride film 15b is exposed to hot phosphoric acid solution heated to 160° C. to remove it. Further, the TEOS film 40 is removed also from the full silicide region. As such, as shown in FIGS. 16A and 16B, the silicon nitride can be formed on the sidewall of the gate electrode 6a in the full silicide region.

After that, similarly to the manufacturing method according to the first embodiment, by forming the silicon oxide films 12a and 12b and through the step of silicidation, the semiconductor device shown in FIGS. 14A ad 14B can be obtained.

The manufacturing method of the semiconductor device according to the second embodiment assures the same effects as those of the manufacturing method of the semiconductor device according to the first embodiment.

The manufacturing method of the semiconductor device according to the second embodiment can be modified as well similarly to the first embodiment. That is, after the material of the silicon nitride films 15a and 15b are deposited, a TEOS film is deposited. Thereafter, the TEOS film is removed only from the non-full silicide region by photolithography and RIE or wet etching. Under the existence of the TEOS film retained in the full silicide region as a mask, the silicon nitride film is entirely removed from the non-full silicide region by etching using hot phosphoric acid solution heated to 160° C. Thereafter, the non-full silicide region is covered with photo resist, the TEOS film is removed by treatment using fluoric acid, and the silicon nitride film in the full silicide region is partly removed by anisotropic etching by RIE. As such, the configuration shown in FIGS. 15A and 15B can be obtained.

Figure 17:
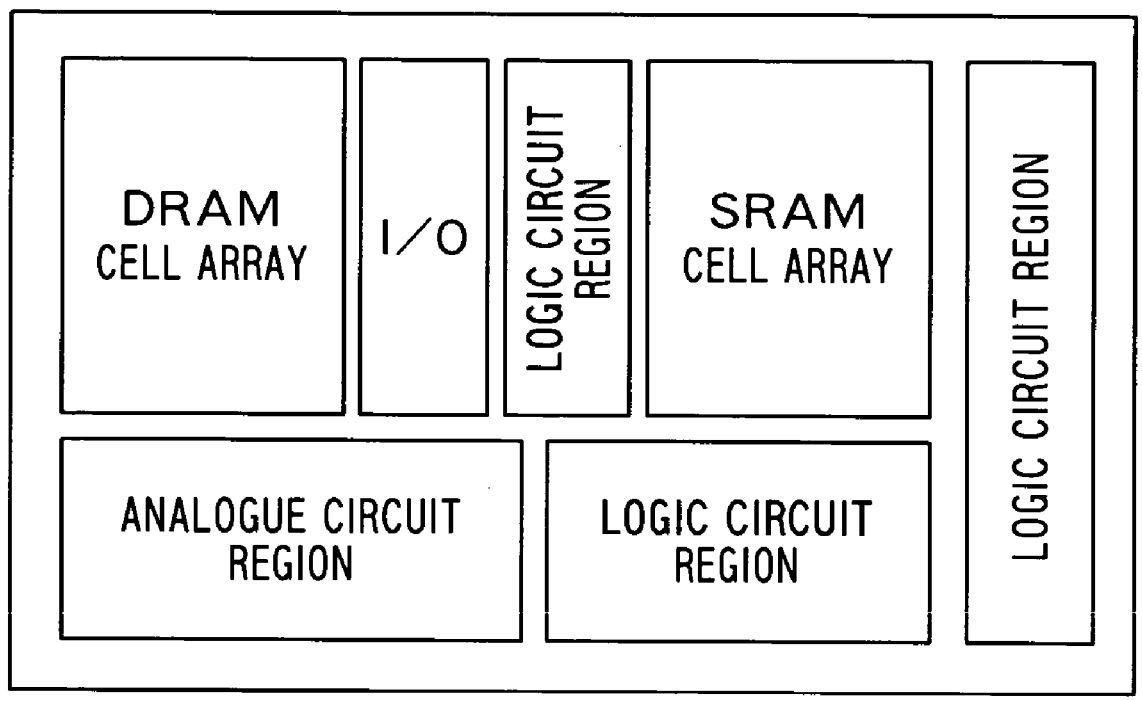
FIG. 17 is a block diagram of a digital/analog mixed circuit including full silicide MOSFETs and non-full silicide MOSFETs on a common substrate.

FIG. 17 is a block diagram of a digital/analog mixed circuit including full silicide MOSFETs and non-full silicide MOSFETs on a common substrate. In the analog circuit region required to be low in gate resistance, logic circuit region, and SRAM region required to be high in switching speed, full silicide MOSFETs are formed. In contrast, in the DRAM region requiring a highly reliable gate insulating film, or in a region directly incorporating an existing circuit, non-full silicide MOSFETs are formed.

The first and second embodiments heretofore explained have been directed to semiconductor devices including transistors of full silicide or non-full silicide gate electrodes on a common substrate. However, it will be apparent to the skilled person in the art that it is possible to form transistors having silicide layers simply different in thickness on a common substrate according to the teachings of the present invention, even without siliciding the entirety of the gate electrodes.

The invention claimed is:

1. A semiconductor device, comprising:
    a first transistor including: a first source layer and a first drain layer both formed in a surface of a semiconductor substrate; a first silicide layer formed on the first source layer and the first drain layer; a first gate electrode formed on a first gate insulating film, which is formed on the surface of the semiconductor substrate and has a second silicide layer; and a silicon nitride film formed on sidewalls of the first gate electrode;
    a second transistor including: a second source layer and a second drain layer both formed in the surface of the semiconductor substrate; a third silicide layer formed on the second source layer and the second drain layer and equal in thickness to the first silicide layer; a second gate electrode formed on second gate insulating film, which is formed on the surface of the semiconductor substrate and has a fourth silicide layer thinner in thickness than the second silicide layer,
    wherein the second silicide layer reaches to the first gate insulating film and is made of a same material as the fourth silicide layer.

2. The semiconductor device according to claim 1, wherein a gate length of the first gate electrode is equal to or less than 50 nm.

3. The semiconductor device according to claim 1, wherein a gate length of the first gate electrode is equal to or less than 20 nm.

4. The semiconductor device according to claim 1, wherein each of the thicknesses of the first silicide layer and the third silicide layer is equal to or less than 30 nm.

5. The semiconductor device according to claim 1, wherein the first transistor further includes: a thin-film silicon oxide layer intervening between the first gate electrode and the silicon nitride layer provided on sidewalls of the first gate electrode.

6. The semiconductor device according to claim 5, wherein a maximum thickness of the silicon nitride layer is equal to or more than 8 nm.

7. The semiconductor device according to claim 5, wherein a maximum thickness of the thin-film silicon oxide layer is equal to or less than 28 nm.

8. The semiconductor device according to claim 5, wherein a maximum thickness of the thin-film silicon oxide layer is equal to or less than 10 nm.

9. The semiconductor device according to claim 1, wherein the first to fourth silicide layers are made of a nickel silicide.

10. The semiconductor device according to claim 1 further comprising:
    a silicon oxide layer provided on the silicon nitride layer of the first transistor.

11. The semiconductor device according to claim 1 further comprising:
    a silicon oxide layer provided on sidewalls of the second gate electrode.

* * * * *